United States Patent
Lee et al.

(10) Patent No.: US 8,404,561 B2
(45) Date of Patent: Mar. 26, 2013

(54) METHOD FOR FABRICATING AN ISOLATION STRUCTURE

(75) Inventors: Tze-Liang Lee, Hsinchu (TW); Pei-Ren Jeng, Chu-Bei (TW); Chu-Yun Fu, Hsinchu (TW); Chyi Shyuan Chern, Taipei (TW); Jui-Hei Huang, Yongkang (TW); Chih-Tang Peng, Taipei (TW); Hao-Ming Lien, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 267 days.

(21) Appl. No.: 12/774,219

(22) Filed: May 5, 2010

(65) Prior Publication Data

US 2010/0291751 A1 Nov. 18, 2010

Related U.S. Application Data

(60) Provisional application No. 61/179,107, filed on May 18, 2009.

(51) Int. Cl.
*H01L 21/76* (2006.01)

(52) U.S. Cl. .................. 438/437; 257/E21.546

(58) Field of Classification Search .................. 438/437, 438/762
See application file for complete search history.

(56) References Cited

U.S. PATENT DOCUMENTS

| | | | |
|---|---|---|---|
| 6,964,893 B2 * | 11/2005 | Matsuo | 438/199 |
| 7,098,141 B1 * | 8/2006 | Kamp et al. | 438/713 |
| 7,160,787 B2 * | 1/2007 | Heo et al. | 438/424 |
| 7,939,422 B2 * | 5/2011 | Ingle et al. | 438/435 |
| 2008/0182383 A1 * | 7/2008 | Lee et al. | 438/437 |

* cited by examiner

*Primary Examiner* — Chandra Chaudhari
(74) *Attorney, Agent, or Firm* — Lowe Hauptman Ham & Berner, LLP (57) ABSTRACT

The invention relates to integrated circuit fabrication, and more particularly to an electronic device with an isolation structure made having almost no void. An exemplary method for fabricating an isolation structure, comprising: providing a substrate; forming a trench in the substrate; partially filling the trench with a first silicon oxide; exposing a surface of the first silicon oxide to a vapor mixture comprising $NH_3$ and a fluorine-containing compound; heating the substrate to a temperature between 100° C. to 200° C.; and filling the trench with a second silicon oxide, whereby the isolation structure made has almost no void.

20 Claims, 6 Drawing Sheets

METHOD FOR FABRICATING AN ISOLATION STRUCTURE

CROSS-REFERENCE TO RELATED APPLICATIONS

The present application claims priority of U.S. Provisional Patent Application Ser. No. 61/179,107 filed on May 18, 2009 which is incorporated herein by reference in its entirety.

TECHNICAL FIELD

This disclosure relates to integrated circuit fabrication, and more particularly to an electronic device with an isolation structure.

BACKGROUND

Because miniaturization of elements in integrated circuit electronic devices drives the industry, the width and the pitch of active regions are increasingly becoming smaller, thus, the use of traditional local oxidation of silicon (LOCOS) isolation techniques is problematic. Shallow trench isolation (STI), because it creates relatively little of the bird's beak characteristic of LOCOS, is considered to be a more viable isolation technique.

A conventional STI fabrication technique typically comprises: forming a pad oxide on an upper surface of a semiconductor substrate; forming a hardmask layer comprising nitride, such as silicon nitride, having a thickness generally greater than 600 Å, on the semiconductor substrate; forming an opening in the hardmask layer; performing anisotropic etching to form a trench in the semiconductor substrate; forming a thermal oxide liner in the trench and then filling the trench with silicon oxide as an insulating material; forming an overburden on the hardmask layer. Chemical vapor deposition (CVD) has been used extensively to deposit silicon oxide in the trench. During deposition, silicon oxide will collect on top corners of the trench, and overhangs will form at the top corners. These overhangs typically grow together faster than the trench is filled, and a void in the dielectric material filling the gap is created.

Figure 1:
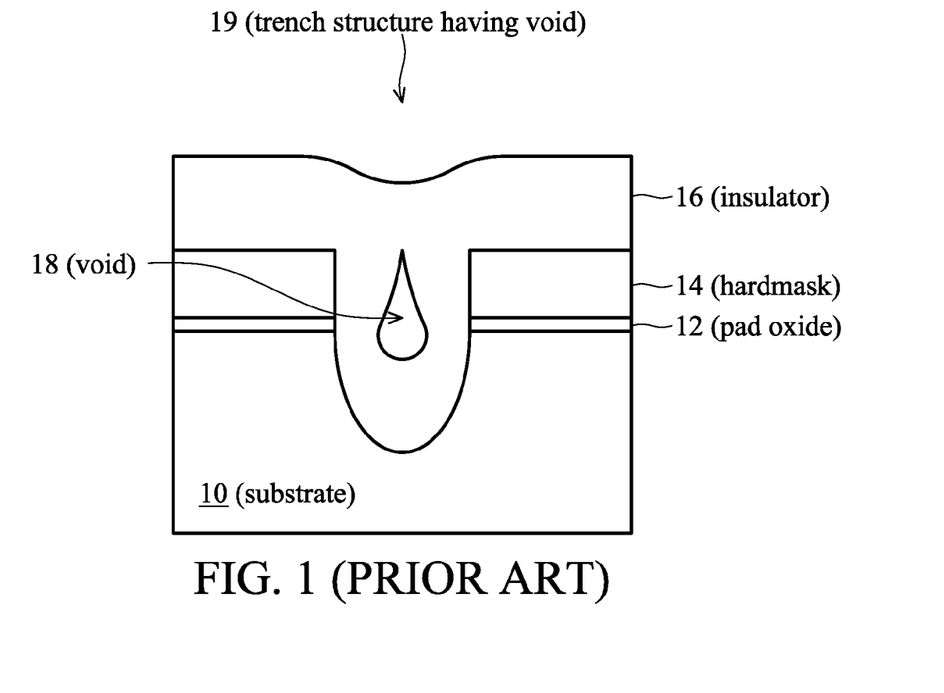
FIG. 1 shows a partial cross-sectional view of a STI structure having a void.

FIG. 1 illustrates a partial cross-sectional view of a STI structure 19 having a void 18. A pad oxide 12 is on a surface of a substrate 10 and a hardmask layer 14 is over the pad oxide 12. A silicon oxide 16 having the void 18 is over the substrate 10 and a portion thereof is embedded in the substrate 10. The void 18 is problematic in various respects. For example, any void 18 present in the trench fill can become a receptacle of polysilicon and/or metals during subsequent processing thereby increasing the likelihood of device instability and/or device failure.

Accordingly, what is needed is a method for fabricating an isolation structure having no void in the silicon oxide from early stage of the isolation formation.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is understood that the following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 2A:
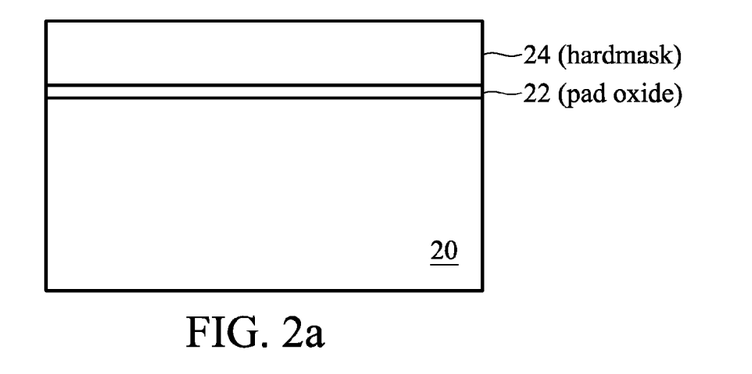
FIGS. 2a-i show schematic cross sections of a substrate processed according to an embodiment of a method for fabricating an isolation structure of the disclosure, showing various stages of fabrication.

FIGS. 2a-i show schematic cross sections representing an isolation structure at various stages of feature formation in an embodiment of an electronic device manufacturing process. Referring to FIG. 2a, a substrate 20 is provided. In one embodiment, the substrate 20 includes a silicon substrate (e.g., wafer) in crystalline structure. Other examples of the substrate 20 may include other elementary semiconductors such as germanium and diamond. Alternatively, the substrate 20 may include a compound semiconductor such as, silicon carbide, gallium arsenide, indium arsenide, or indium phosphide. The substrate 20 may include various doping configurations depending on design requirements (e.g., p-type substrate or n-type substrate). Further, the substrate 20 may include an epitaxial layer (epi layer), and/or may be strained for performance enhancement, and/or may include a silicon-on-insulator (SOI) structure.

Still referring to FIG. 2a, a pad oxide layer 22 is formed over the top surface of the substrate 20. The pad oxide layer 22 is preferably formed of silicon oxide grown by a thermal oxidation process, having a thickness of about 80 to 150 Å. For example, the pad oxide layer 22 can be grown by the rapid thermal oxidation (RTO) process or in a conventional annealing process which includes oxygen. A hardmask layer 24, for example a silicon nitride or silicon oxynitride layer, is formed over the pad oxide layer 22. The hardmask layer 24 can be deposited by, for example, a CVD process, or a low pressure CVD (LPCVD) process or a diffusion process. Preferably the formed hardmask layer 24 has a thickness of about 600 to 1500 Å.

Figure 2B:
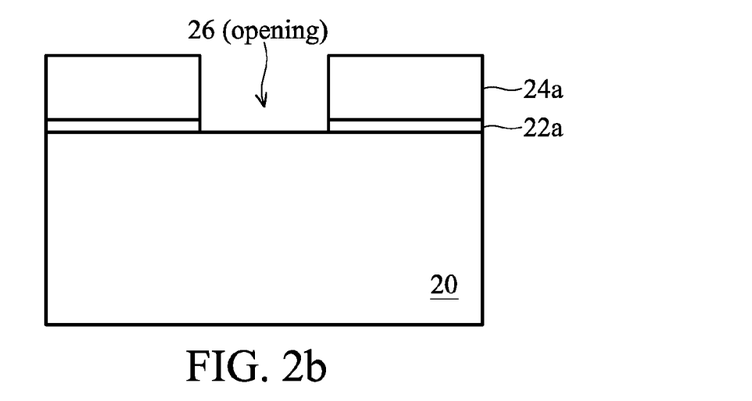

Referring to FIG. 2b, following formation of the hardmask layer 24, a patterned photo-sensitive layer (not shown) is formed on the hardmask layer 24. A reactive ion etching (RIE) may, for example, be used to anisotropically etch through the hardmask layer 24 and the pad oxide layer 22 to form an opening 26 in the hardmask layer 24a and the pad oxide layer 22a, exposing a portion of the substrate 20.

Figure 2C:
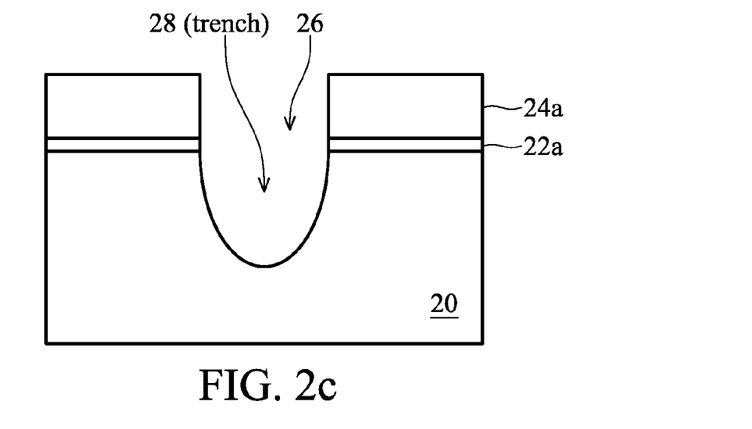

Referring to FIG. 2c, following formation of the opening 26 in the hardmask layer 24a and the pad oxide layer 22a, the exposed portion of the substrate 20 is etched to form a trench 28 having a predetermined depth of between about 300 to 3000 Å in the substrate 20. Preferably, the trench 28 is etched to have sloped trench sidewalls, preferably having an angle between about 80°~90° with rounded top and bottom rounded corners to minimize stress. Subsequently, the patterned photo-sensitive layer is stripped after the trench 28 formation.

Figure 2D:
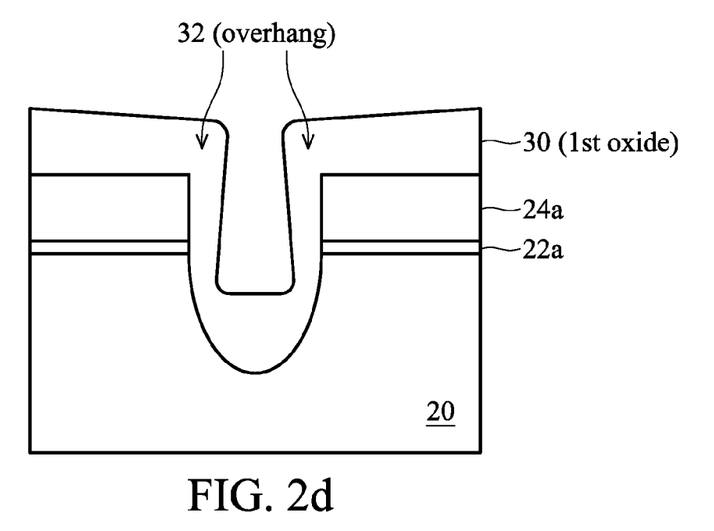

Referring to FIG. 2d, following formation of the trench 28, a liner layer (not shown) may be formed substantially conformal over the substrate 20, including along the walls of the trench 28. The liner layer is a dielectric layer (e.g., an oxide layer, nitride layer, oxynitride layer or combination thereof) formed by a thermal oxidation process or CVD process. Preferably, the liner layer may have a thickness of about 30 to 200 Å. In some embodiments, the liner layer is provided for reducing damage on the surface of the trench 28 created by the opening-etch process as set forth above. In some embodiments, the liner layer is not used.

Still referring to FIG. 2d, following formation of the liner layer, a first silicon oxide layer 30 is formed over the liner layer, partially filling the trench 28 and the opening 26. The first silicon oxide layer 30 has less conformal step coverage so that it can be formed thicker at a top portion of the sidewalls than a bottom portion of the sidewalls of the trench 28 and the opening 26. In other words, the first silicon oxide layer 30 is formed on the sidewalls of the trench 28 and the opening 26 to form a constricted opening having an overhang 32 structure, leading to a shadowing effect as the first silicon oxide layer 30 is deposited within the trench 28 and the opening 26.

Preferably, the first silicon oxide layer 30 can be formed using a high-density plasma chemical vapor deposition (HDP-CVD) process. HDP-CVD forms a pure oxide than other CVD processes, and it is preferred to have a more pure oxide in contact with the substrate 20. For example, the first silicon oxide 30 can be deposited under a low frequency power less than 5000 W, a high frequency power less than 3500 W, a pressure less than 10 mTorr and a temperature of about 500 to 1000° C., using silane and oxygen as reacting precursors. The first silicon oxide layer 30 is preferably formed to a thickness of about 300 to about 2000 angstroms.

Still referring to FIG. 2d, following formation of the first silicon oxide layer 30 within the trench 28 and the opening 26, an anneal process may be performed to increase the density of the first silicon oxide layer 30. The anneal process results in the removal of any an interface between the liner layer (not shown) and the first silicon oxide layer 30. The anneal process can be performed, for example, in a furnace, a rapid thermal process (RTP) system or other thermal system that is adapted to provide a thermal treatment for the first silicon oxide layer 30 to obtain a desired film quality. In some embodiments, the anneal process may be performed at about 1000° C. for about 20 seconds in a RTP system in an environment containing nitrogen, an inert gas or other gas that will not substantially react with the first silicon oxide layer 30. In some embodiments, the anneal process is not performed.

Figure 2E:
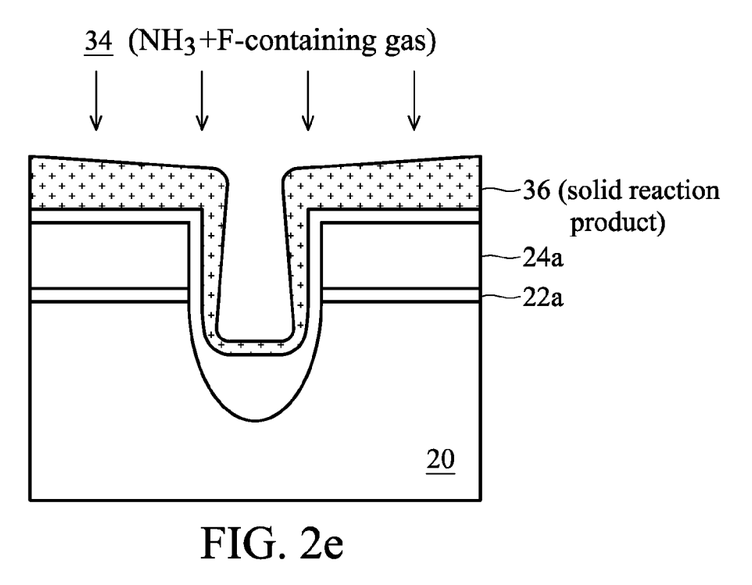
Figure 2F:
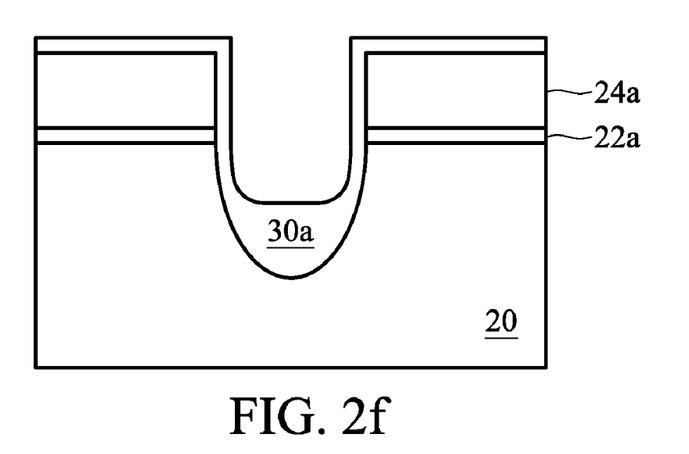

Referring to FIG. 2e, after the first silicon oxide layer 30 formation process, a vapor phase etching process is used to remove the overhang 32 structure. The vapor phase etching process starts with introducing the structure of FIG. 2d into a sealed reaction chamber in which the vapor phase etching process uses gas phase reactants. The etching process is self-limiting, in that amount of material removed is determined by amount of the gas phase reactants introduced into the reaction chamber. In some embodiments, the vapor phase etching process employed in the present disclosure comprises a vapor mixture 34 including at least an NH3 and a fluorine-containing compound employed as a catalyst and an etchant, respectively. The fluorine-containing compound may be a compound selected from the group consisting of HF or NF3.

In one embodiment, the vapor mixture 34 comprises HF and NH3. The vapor mixture of NH3 and HF comprises a ratio of NH3 to HF between about 0.1 to 10, and preferably a ratio of 1 part NH3 to 1 part HF. In another embodiment, the vapor mixture 34 comprises NH3 and NF3. The vapor mixture of NH3 and NF3 comprises a ratio of NH3 to NF3 between about 0.5 to 5, preferably a ratio of 2 parts NH3 to 1 part NF3.

The vapor phase etching process is a multiple step process. For a first step, a blanket adsorbed reactant film (not shown) of the vapor mixture 34 of fluorine-containing compound and NH3 vapor may be formed over the top surface of the first silicon oxide layer 30 in the reaction chamber. The blanket adsorbed reactant film is non-uniform due to the overhang 32 structure partially blocking the opening 26 and limiting entrance of the vapor mixture 34 of fluorine-containing compound and NH3 vapor into interior surface of the trench 28. Because of the overhang 32, less reaction gas reaches bottom of the trench 28, so more of the overhang 32 reacts and less material is removed from the bottom of the trench 28. In one embodiment, the first step using the vapor mixture 34 of NH3 and HF is performed at a pressure between 20 mTorr and 100 mTorr and at a temperature between 20° C. and 70° C. In another embodiment, the first step using the vapor mixture 34 of NH3 and NF3 is performed at a pressure between 2 Torr and 4 Torr and at a temperature between 20° C. and 70° C.

For a second step, the adsorbed reactant film may react with the top surface of the first silicon oxide layer 30 in contact therewith to form a condensed and solid reaction product 36 beneath the adsorbed reactant film. In some embodiments, reaction radicals may be generated in a plasma from fluorine-containing compound and NH3 precursor gases in the reaction chamber. The reaction radicals may react with the top surface of the first silicon oxide layer 30 in contact therewith to form a condensed and solid reaction product 36.

Next, the reaction chamber may be heated to a temperature between 100° C. to 200° C. while sublimation products of the solid reaction product 36 may be pumped out from the reaction chamber. In alternative embodiments, the reaction chamber may be heated to a temperature between 100° C. to 200° C. while flowing a carrier gas over the substrate 20 to remove sublimation products of the solid reaction product 36 from the reaction chamber. The carrier gas can be any inert gas. Preferably, the carrier gas comprises N2, He, or Ar. In some embodiments, the substrate 20 is transferred into a heated chamber that is heated to a temperature between 100° C. to 200° C. while sublimation products of the solid reaction product 36 may be pumped out from the heated chamber. In alternative embodiments, the substrate 20 is transferred into a heated chamber that is heated to a temperature between 100° C. to 200° C. while flowing a carrier gas over the substrate 20 to remove sublimation products of the solid reaction product 36 from the heated chamber. The carrier gas can be any inert gas. Preferably, the inert gas includes N2, He, and Ar.

This reaction proceeds until solid reaction product 36 is removed; and continues until less thickness of the interior surface of the trench 28 is removed. Accordingly, at the end of the vapor phase etching process 34 shown in FIG. 2f, a substantial amount of the first silicon oxide layer 30a is remained, resulting in reduced aspect ratio of the opening 26 and the trench 28. In some embodiments, the vapor phase etching process 34 may fully etch the overhang 32 structure, exposing sidewall surfaces of the hardmask layer 24a, the pad oxide layer 22a and the silicon substrate 20 (not shown). However, it is preferable not to etch through the hardmask layer 24a by the vapor phase etching process 34. The attacked hardmask layer 24a may not serve as a stop layer in subsequent processes thereby increasing the likelihood of active area damage. In one embodiment, a ratio of removal rates by the vapor mixture 34 of the first silicon oxide 30 and the hardmask layer 24a is greater than 10. In other words, the first silicon oxide layer 30 removal rate is greater than 10 times of the removal rate of the hardmask layer 24a. Furthermore, the silicon substrate 20 is preferably not attacked by the vapor phase etching process 34. The attacked silicon substrate 20 will act as a source of crystal defects in subsequent processes thereby increasing the likelihood of electrical leakage. In one embodiment, a ratio of removal rates by the vapor mixture 34 of the first silicon oxide 30 and the silicon substrate 20 is greater than 30. In other words, the first silicon oxide layer 30 removal rate is greater than 30 times of the removal rate of the silicon substrate 20. Furthermore, repeated deposition/etch sequence may be required as more reduced aspect ratio of the opening 26 and the trench 28 is needed.

Figure 2G:
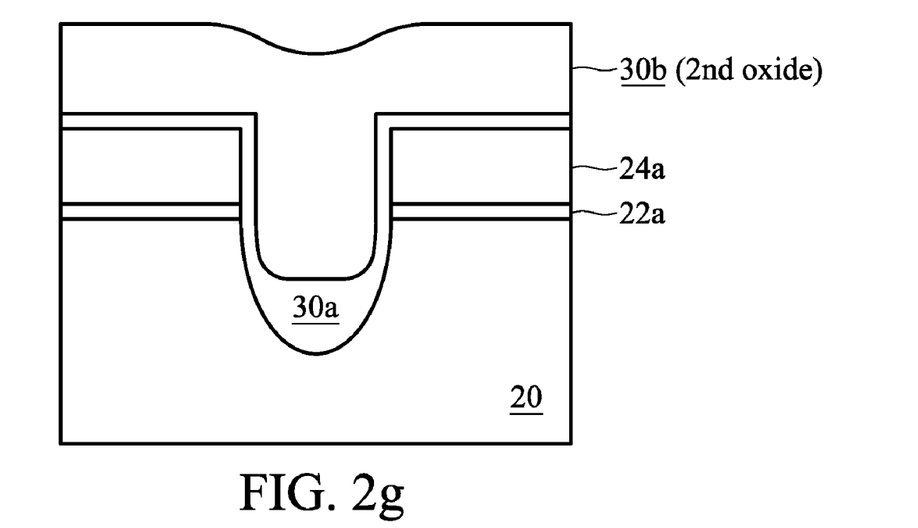

Referring to FIG. 2g, following formation of the reduced aspect ratio of the opening 26 and the trench 28. A second silicon oxide layer 30b is formed over the first silicon oxide layer 30a to a sufficient thickness to form a void-free silicon oxide layers 30a and 30b within the opening 26 and the trench 28. For example, the second silicon oxide layer 30b is preferably deposited to a thickness of 4000 to 8000 Å. In one embodiment, the second silicon oxide layer 30b can be formed by a CVD process, such as HDP CVD process or sub-atmospheric CVD (SACVD) process. For example, the second silicon oxide layer 30b comprises a HDP-CVD oxide layer. Other deposition can be used because the second oxide layer 30b can be less pure than the first oxide layer 30. The second silicon oxide layer 30b can be deposited under a low frequency power less than 5000 W, a high frequency power less than 3500 W, a pressure less than 10 mTorr and a temperature of about 500 to 1000° C., using silane and oxygen as reacting precursors. For another example, the second silicon oxide layer 30b comprises a sub-atmospheric undoped-silicon glass (SAUSG) layer. The second silicon oxide layer 30b can be deposited under a pressure of about 500 to 700 Torr and a temperature of about 500 to 600° C., using tetraethoxysilane (TEOS) and $O_3$ as reacting precursors. In other embodiment, the second silicon oxide layer 30b can be formed by a spin-on-dielectric (SOD) process, for example, the first silicon oxide layer 30a is spin coated with a material comprising the second silicon oxide layer 30b, such as hydrogen silsesquioxane (HSQ) or methyl silsesquioxane (MSQ). The spin-coated material is baked at a temperature of 150 to 300° C., and then cured at 400 to 450° C. in a furnace or a hot-plate bake tool to form the second silicon oxide layer 30b.

Still referring to FIG. 2g, following formation of the second silicon oxide layer 30b within the trench 28 and the opening 26, an anneal process is performed to increase the density of the void-free silicon oxide layers 30a and 30b. This results in an interface between the first silicon oxide layer 30a and the second silicon oxide layer 30b that will disappear after the anneal process. The anneal process can be performed, for example, in a furnace, a rapid thermal process (RTP) system or other thermal system that is adapted to provide a thermal treatment for the void-free silicon oxide layers 30a and 30b to obtain a desired film quality. In some embodiments, the anneal process may be performed at about 1000° C. for about 20 seconds in a RTP system in an environment containing nitrogen, an inert gas or other gas that will not substantially react with the void-free silicon oxide layers 30a and 30b.

Figure 2H:
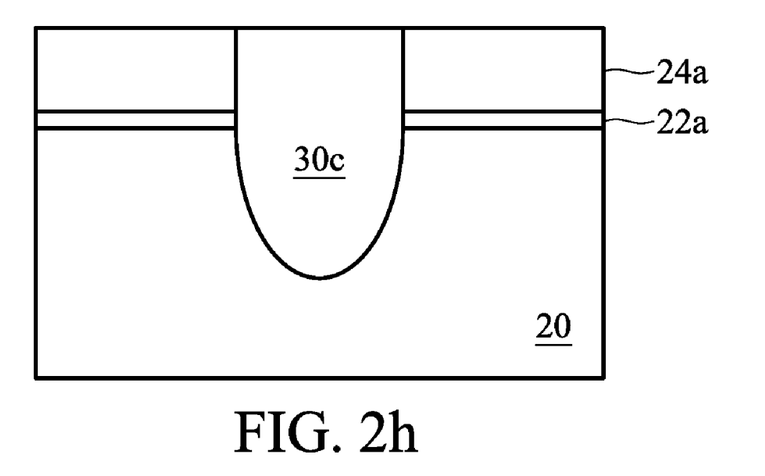

FIG. 2h shows the substrate 20 of FIG. 2g after a planarization process, such as a chemical mechanical polishing (CMP) process, is performed to remove portions of the void-free silicon oxide layers 30a and 30b above the hardmask layer 24a to expose the hardmask layer 24a, thereby leaving a void-free silicon oxide layer 30c respectively filling the trench 28 and the openings 26. The hardmask layer 24a also serves as a stop layer for stopping the planarization process on the hardmask layer 24a. In some embodiments, a top surface of the void-free silicon oxide layer 30c is coplanar with, or substantially coplanar with, the hardmask layer 24a.

Figure 2I:
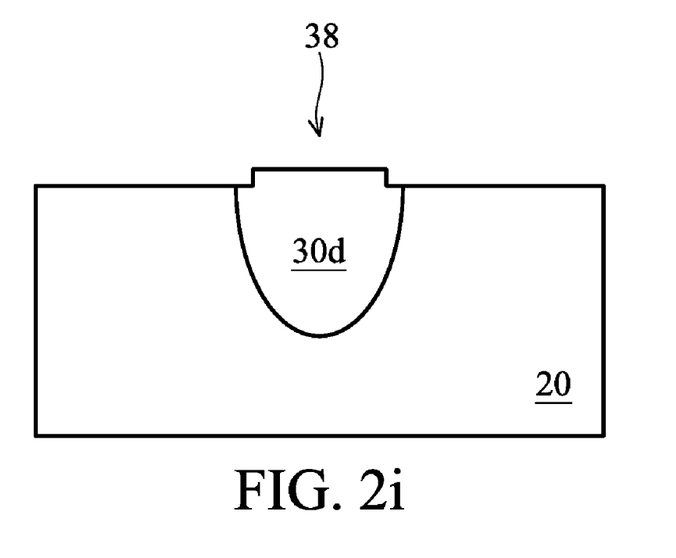

Referring to FIG. 2i, after the planarization process, the hardmask layer 24a is removed by a wet chemical etching process, for example, by dipping the substrate 20 in hot phosphoric acid ($H_3PO_4$), exposing a top surface of the pad oxide layer 22a. Because the wet chemical etching process has higher etch selectivity for nitride than to oxide, the etch process removes the hardmask layer 24a faster than the void-free silicon oxide layer 30c. Accordingly, the remaining void-free silicon oxide layer 30c extends over a top surface of the pad oxide layer 22a.

Still referring to FIG. 2i, subsequent to the hardmask layer removal process, the pad oxide layer 22a is removed by a vapor phase etching process or a wet etching process, for example, by dipping the substrate 20 in hydrofluoric (HF), exposing the top surface of the substrate 20. Since the wet chemical etching process has almost no selectivity for the pad oxide layer 22a and the void-free silicon oxide layer 30c, the void-free silicon oxide layer 30c may lose almost the same thickness as the pad oxide layer 22a does. Accordingly, at the end of the wet etching process, a silicon oxide layer 30d made has almost no void and serves as an isolation structure 38 between electronic devices. The isolation structure 38 still partially protrudes over a top surface of the substrate 20. Accordingly, the above method of fabricating an isolation structure produces a void-free silicon oxide layer 30d.

Figure 3:
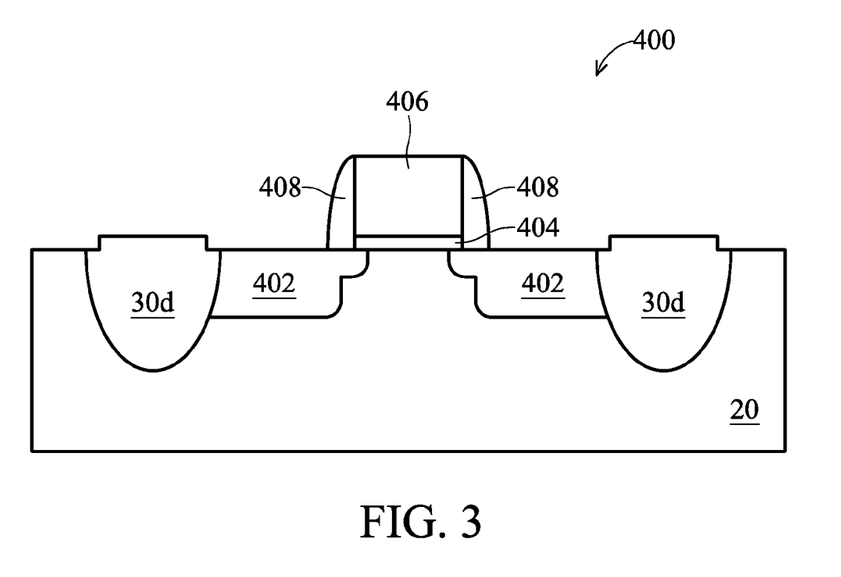
FIG. 3 is a cross-sectional view of an electronic device having an isolation structure fabricated using the steps shown in FIG. 2a-i.

Referring to FIG. 3, an electronic device such as a metal-oxide-semiconductor (MOS) transistor 400 can be formed over a portion of the substrate 20 adjacent to the isolation structure 38. Fabrication of the MOS transistor 400 is well known to those skilled in the art and is thus not described here, for brevity. The MOS transistor 400 now includes source/drain regions 402 formed in a portion of the substrate 20, a gate stack comprised of a gate dielectric layer 404 and a gate electrode 406 sequentially formed over the substrate 20, and spacers 408 respectively formed on both sidewalls of the gate stack. In some embodiment, the electronic device comprises a gate with a gate length less than 32 nm.

In some embodiments, the gate dielectric layer 404 may comprise silicon oxide, silicon oxynitride, a high-k dielectric layer or combinations thereof. The high-k dielectric layer may comprise hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), metal oxides, metal nitrides, metal silicates, transition metal-oxides, transition metal-nitrides, transition metal-silicates, oxynitrides of metals, metal aluminates, zirconium silicate, zirconium aluminate, silicon nitride, silicon oxynitride, zirconium oxide, titanium oxide, aluminum oxide, hafnium dioxide-alumina ($HfO_2$—$Al_2O_3$) alloy, other suitable high-k dielectric materials, and/or combinations thereof. The gate dielectric layer 404 may further comprise an interfacial layer to reduce damage between the gate dielectric layer 404 and the substrate 20. The interfacial layer may comprise silicon oxide.

In some embodiments, the gate electrode 406 may comprise a polysilicon gate and/or a metal gate. The metal gate may comprise one or more layers including Ti, TiN, TaN, Ta, TaC, TaSiN, W, WN, MoN, MoON, $RuO_2$, and/or other suitable materials. The metal gate may comprise one or more layers formed by PVD, CVD, ALD, plating, and/or other suitable processes. The metal gate may be formed by a gate-first or a gate-last metal gate fabrication process.

While the preferred embodiments have been described by way of example it is to be understood that the scope of invention is not limited to the disclosed embodiments. To the contrary, it is intended to cover various modifications and similar arrangements (as would be apparent to those skilled in the art). Therefore, the scope of the disclosure should be accorded the broadest interpretation so as to encompass all such modifications and similar arrangements. The disclosure can be used to form or fabricate an isolation structure with a void-free silicon oxide layer. In this way, an isolation structure or region is formed with a void-free silicon oxide layer.

What is claimed is:

1. A method for fabricating an isolation structure, comprising:
    providing a substrate;
    forming a trench in a top surface of the substrate, the trench having rounded bottom corners;
    partially filling the trench with a first silicon oxide;
    producing a solid reaction product in a top portion of the first silicon oxide by exposing a surface of the first silicon oxide to a vapor mixture comprising NH3 and a fluorine-containing compound;
    sublimating the solid reaction product by heating the substrate to a temperature between 100° C. to 200° C.;
    removing the sublimated solid reaction product by flowing a carrier gas over the substrate; and
    filling the trench with a second silicon oxide, whereby the isolation structure made has almost no void.

2. The method of claim 1 wherein the step of forming the trench comprises:
    forming a hardmask layer over the substrate;
    patterning the hardmask layer to form an opening in the hardmask layer, exposing a portion of the substrate; and
    removing the hardmask layer.

3. The method of claim 1 further comprising forming an electronic device over a portion of the substrate adjacent to the isolation structure, wherein the electronic device comprises a gate with a gate length less than 32 nm.

4. The method of claim 2, wherein the hardmask layer comprises silicon nitride.

5. The method of claim 2, wherein a ratio of removal rates by the vapor mixture of the first silicon oxide and the hardmask layer is greater than 10.

6. The method of claim 1, wherein a ratio of removal rates by the vapor mixture of the first silicon oxide and the substrate is greater than 30.

7. The method of claim 1, wherein the step of partially filling the trench with a first silicon oxide comprises depositing silicon oxide by high density plasma chemical vapor deposition (HDP-CVD).

8. The method of claim 1, wherein the step of filling the trench with a second silicon oxide comprises depositing silicon oxide by one of high density plasma chemical vapor deposition (HDPCVD), sub-atmospheric chemical vapor deposition (SACVD) or spin-on deposition (SOD).

9. The method of claim 1, wherein the isolation structure partially protrudes over the top surface of the substrate.

10. The method of claim 1, wherein the step of exposing a surface of the first silicon oxide to the vapor mixture is performed at a temperature between 20° C. and 70° C.

11. The method of claim 1, wherein the fluorine-containing compound is a compound selected from the group consisting of HF or NF3.

12. The method of claim 1, wherein the vapor mixture comprises HF and NH3.

13. The method of claim 12, wherein the vapor mixture of HF and NH3 comprises a ratio of 1 part HF to 1 part NH3.

14. The method of claim 12, wherein the step of exposing a surface of the first silicon oxide to the vapor mixture is performed at a pressure between 20 mTorr and 100 mTorr.

15. The method of claim 1, wherein the vapor mixture comprises NF3 and NH3.

16. The method of claim 15, wherein the vapor mixture of NF3 and NH3 comprises a ratio of 1 part NF3 to 2 parts NH3.

17. The method of claim 15, wherein the step of exposing a surface of the first silicon oxide to the vapor mixture is performed at a pressure between 2 Torr and 4 Torr.

18. A method for fabricating an isolation structure, comprising:
    providing a substrate;
    forming a trench in a top surface of the substrate;
    partially filling the trench with a first silicon oxide;
    exposing a surface of the first silicon oxide to a vapor mixture comprising NH3 and a fluorine-containing compound to form a product on the surface;
    heating the substrate to a temperature between 100° C. to 200° C. to remove the product from the surface; and
    filling the trench with a second silicon oxide, whereby the isolation structure made has almost no void, wherein the step of heating the substrate comprises flowing a carrier gas over the substrate.

19. The method of claim 18, wherein the carrier gas comprises an inert gas.

20. The method of claim 19, wherein the inert gas comprises one of N2, He, or Ar.

* * * * *